(12) United States Patent
Kaibe et al.

(10) Patent No.: US 9,793,462 B2
(45) Date of Patent: Oct. 17, 2017

(54) THERMOELECTRIC MODULE, THERMOELECTRIC POWER GENERATING APPARATUS, AND THERMOELECTRIC GENERATOR

(71) Applicant: KELK, Ltd., Hiratsuka-shi, Kanagawa (JP)

(72) Inventors: Hiromasa Kaibe, Kawasaki (JP); Kazuya Makino, Hiratsuka (JP); Kouji Nagano, Hiratsuka (JP); Hirokuni Hachiuma, Hiratsuka (JP)

(73) Assignee: KELK Ltd., Hiratsuka-shi, Kanagawa (JP)

( * ) Notice: Subject to any disclaimer, the term of this patent is extended or adjusted under 35 U.S.C. 154(b) by 158 days.

(21) Appl. No.: 14/379,626

(22) PCT Filed: Feb. 7, 2013

(86) PCT No.: PCT/JP2013/052822
§ 371 (c)(1),
(2) Date: Aug. 19, 2014

(87) PCT Pub. No.: WO2013/129057
PCT Pub. Date: Sep. 6, 2013

(65) Prior Publication Data
US 2015/0013740 A1    Jan. 15, 2015

(30) Foreign Application Priority Data

Feb. 27, 2012    (JP) .................................. 2012-040385

(51) Int. Cl.
*H01L 35/32*    (2006.01)
*H01L 35/10*    (2006.01)
*H01L 35/30*    (2006.01)

(52) U.S. Cl.
CPC .............. *H01L 35/32* (2013.01); *H01L 35/10* (2013.01); *H01L 35/30* (2013.01); *H01L 35/325* (2013.01)

(58) Field of Classification Search
CPC ....... H01L 35/325; H01L 35/32; H01L 35/30; H01L 35/10
See application file for complete search history.

(56) References Cited

U.S. PATENT DOCUMENTS 3,326,726 A * 6/1967 Bassett, Jr .............. H01L 35/32
136/203
6,097,088 A * 8/2000 Sakuragi ................. C30B 11/00
257/467

(Continued)

FOREIGN PATENT DOCUMENTS

CN    101952985 A    1/2011
CN    102130289 A    7/2011

(Continued)

OTHER PUBLICATIONS

JP2006-245224A, Machine Translation, Fujita, Sep. 2006.*

(Continued)

*Primary Examiner* — Devina Pillay
(74) *Attorney, Agent, or Firm* — Drinker Biddle & Reath LLP

(57) ABSTRACT

A thermoelectric module includes a low temperature-side wiring line, a high temperature-side wiring line, a low temperature-side member, a plurality of low temperature-side thermoelectric conversion elements made of a BiTe-based material, a high temperature-side member, a plurality of high temperature-side thermoelectric conversion elements made of a material different from the BiTe-based material, an insulating member, a radiant heat blocking plate, a low temperature-side electrode, and a high temperature-side electrode. The radiant heat blocking plate is (Continued)

arranged on the side of the high temperature-side member with respect to the low temperature-side wiring line and the high temperature-side wiring line. A thermoelectric module that can restrain burning of wiring lines, as well as a thermoelectric power generating apparatus and a thermoelectric generator including the same can thereby be obtained.

11 Claims, 17 Drawing Sheets

(56) References Cited

U.S. PATENT DOCUMENTS

| | | | |
|---|---|---|---|
| 2002/0179135 A1* | 12/2002 | Shutoh | H01L 35/20 136/200 |
| 2005/0194034 A1* | 9/2005 | Yamaguchi | H01L 35/30 136/205 |
| 2011/0023930 A1 | 2/2011 | Konig et al. | |
| 2011/0168224 A1 | 7/2011 | Cho | |
| 2011/0314798 A1* | 12/2011 | Limbeck | F01N 5/025 60/320 |

FOREIGN PATENT DOCUMENTS

| | | | | |
|---|---|---|---|---|
| JP | H03-70483 A | | 3/1991 | |
| JP | H10-79532 A | | 3/1998 | |
| JP | 2000-091649 A | | 3/2000 | |
| JP | 2000-244024 | * | 9/2000 | ............ H01L 35/32 |
| JP | 2000-286469 A | * | 10/2000 | ............ H01L 35/32 |
| JP | 2004-064015 A | | 2/2004 | |
| JP | 2004-064015 A | * | 2/2004 | ............ H01L 35/06 |
| JP | 2004-281451 A | * | 10/2004 | ............ H01L 35/32 |
| JP | 2005-079347 A | | 3/2005 | |
| JP | 2006-165457 A | | 6/2006 | |
| JP | 2006-245224 A | * | 9/2006 | ............ H01L 35/32 |
| JP | 2007-266444 A | * | 10/2007 | ............ H01L 35/10 |
| JP | 2008-034664 A | | 2/2008 | |
| JP | 2009-141079 A | | 6/2009 | |
| JP | 2012-038980 A | | 2/2012 | |

OTHER PUBLICATIONS

JP2004-281451A, Machine Translation, Kishi, Oct. 2004.*
JP2004-064015A, Machine Translation, Kitani, Feb. 2004.*
JP2000-286469A, Machine Translation, Kushibiki, Oct. 2000.*
Kanetsuka, JP2007-266444 A Machine Translation, Oct. 2007.*
Yoshioka, JP2000-244024, Machine Translation, Sep. 2000.*
JP2000-244024, Machine Translation, Yoshioka, Sep. 2000.*

* cited by examiner

THERMOELECTRIC MODULE, THERMOELECTRIC POWER GENERATING APPARATUS, AND THERMOELECTRIC GENERATOR

TECHNICAL FIELD

The present invention relates to a thermoelectric module, a thermoelectric power generating apparatus, and a thermoelectric generator, and particularly relates to a cascade-type thermoelectric module, as well as a thermoelectric power generating apparatus and a thermoelectric generator including the same.

BACKGROUND ART

As is well known, a thermoelectric conversion element can convert electrical energy into thermal energy by the Pertier effect, and can convert thermal energy into electrical energy by the Seebeck effect. In order to increase efficiency and capacity of such thermoelectric conversion, a thermoelectric module including a plurality of aligned thermoelectric conversion elements is produced and utilized.

A thermoelectric module including a plurality of thermoelectric conversion elements is disclosed in, for example, Japanese Patent Laying-Open No. 2005-79347 (PTD 1). In the thermoelectric module described in this publication, the thermoelectric conversion elements are sandwiched between a high temperature-side insulating substrate and a low temperature-side insulating substrate. A lead wire electrically connected to the thermoelectric conversion elements is attached to the low temperature-side insulating substrate. An anti-radiation plate is provided between the high temperature-side insulating substrate and the low temperature-side insulating substrate. By providing the anti-radiation plate, this thermoelectric module reduces the amount of heat not passing through the thermoelectric conversion elements by radiation and convection in the thermoelectric module to improve heat transfer of the thermoelectric module. Improvement in thermoelectric conversion efficiency is thereby achieved.

CITATION LIST

Patent Document

PTD 1: Japanese Patent Laying-Open No. 2005-79347

SUMMARY OF INVENTION

Technical Problem

Thermoelectric conversion elements have high thermoelectric conversion efficiency in different temperature ranges from each other depending on their materials. Therefore, by respectively using thermoelectric conversion elements made of different materials in temperature ranges where high thermoelectric conversion efficiency is exhibited, thermoelectric conversion efficiency can be improved in a thermoelectric module as a whole. For this reason, a cascade-type thermoelectric module has been proposed in which thermoelectric conversion elements made of different materials are stacked one upon another, with thermoelectric conversion elements made of a material having high thermoelectric conversion efficiency in a high temperature range being arranged on the high temperature side, and thermoelectric conversion elements made of a material having high thermoelectric conversion efficiency in a low temperature range being arranged on the low temperature side.

This cascade-type thermoelectric module is disadvantageous in that, since a wiring line for high temperature-side thermoelectric conversion elements is located on the high temperature side, the wiring line is burnt by heat on the high temperature side.

The present invention was made in view of the above-described problem, and has an object to provide a thermoelectric module that can restrain burning of a wiring line, as well as a thermoelectric power generating apparatus and a thermoelectric generator including the same.

Solution to Problem

A thermoelectric module of the present invention includes a low temperature-side member, a plurality of low temperature-side thermoelectric conversion elements, a low temperature-side electrode, a low temperature-side wiring line, a high temperature-side member, a plurality of high temperature-side thermoelectric conversion elements, a high temperature-side electrode, a high temperature-side wiring line, an insulating member, and a radiant heat blocking plate. The plurality of low temperature-side thermoelectric conversion elements are arranged on the side of the low temperature-side member and made of a BiTe (bismuth tellurium)-based material. The low temperature-side electrode connects the plurality of low temperature-side thermoelectric conversion elements electrically in series or in parallel. The low temperature-side wiring line is electrically connected to the low temperature-side electrode. The high temperature-side member is opposed to the low temperature-side member. The plurality of high temperature-side thermoelectric conversion elements are arranged on the side of the high temperature-side member and made of a material different from the BiTe-based material. The high temperature-side electrode connects the plurality of high temperature-side thermoelectric conversion elements electrically in series or in parallel. The high temperature-side wiring line is electrically connected to the high temperature-side electrode. The insulating member is sandwiched between the low temperature-side thermoelectric conversion elements and the high temperature-side thermoelectric conversion elements. The radiant heat blocking plate is arranged between the insulating member and the high temperature-side member. The radiant heat blocking plate is arranged on the side of the high temperature-side member with respect to the low temperature-side wiring line and the high temperature-side wiring line.

According to the thermoelectric module of the present invention, the insulating member is sandwiched between the low temperature-side thermoelectric conversion elements made of a BiTe-based material and the high temperature-side thermoelectric conversion elements made of a material different from the BiTe-based material. The radiant heat blocking plate is arranged between the insulating member and the high temperature-side member, and arranged on the side of the high temperature-side member with respect to the low temperature-side wiring line and the high temperature-side wiring line. Accordingly, in a cascade-type thermoelectric module having a plurality of high temperature-side thermoelectric conversion elements and a plurality of low temperature-side thermoelectric conversion elements, burning of the high temperature-side wiring line can be restrained by blocking radiant heat from the high temperature-side member with the radiant heat blocking plate.

The above-described thermoelectric module further includes a thermal circuit member connecting the radiant heat blocking plate to the low temperature-side member. Accordingly, the radiant heat blocking plate can be restrained from rising in temperature by transferring heat of the radiant heat blocking plate to the low temperature-side member through the thermal circuit member. Therefore, burning of the high temperature-side wiring line due to radiant heat from the radiant heat blocking plate can be restrained.

According to the above-described thermoelectric module, the thermal circuit member includes a spring member. Accordingly, elastic deformation of the spring member can restrain thermal stress produced in the thermal circuit member due to thermal deformation of the radiant heat blocking plate. Therefore, breakdown of the thermal circuit member can be restrained.

According to the above-described thermoelectric module, the low temperature-side member includes a low temperature-side plate connected to the thermal circuit member. Accordingly, the radiant heat blocking plate can be restrained from rising in temperature by transferring heat of the radiant heat blocking plate to the low temperature-side plate through the thermal circuit member.

According to the above-described thermoelectric module, the low temperature-side member includes a low temperature-side soaking plate made of an insulating material and sandwiched between the plurality of low temperature-side thermoelectric conversion elements and the low temperature-side plate. Accordingly, the distribution of heat from the low temperature-side plate can be made uniform by the low temperature-side soaking plate.

According to the above-described thermoelectric module, the radiant heat blocking plate includes an insulating substrate, and a covering part covering at least part of a surface of the insulating substrate on the side of the high temperature-side member. Accordingly, insulation from the high temperature-side thermoelectric conversion elements can be ensured because of the insulating substrate, and radiant heat from the high temperature-side member can be reflected by the covering part.

According to the above-described thermoelectric module, the high temperature-side thermoelectric conversion elements contain one or more kinds of materials selected from the group consisting of a MgSi (magnesium silicon)-based material, a SiGe (silicon germanium)-based material, a CoSb (cobalt antimony)-based material, and a PbTe (lead tellurium)-based material. Accordingly, they are each used in a temperature range where high thermoelectric conversion efficiency is exhibited, so that thermoelectric conversion efficiency can be improved.

According to the above-described thermoelectric module, the low temperature-side thermoelectric conversion elements are attached to the low temperature-side electrode with a solder material, and the high temperature-side thermoelectric conversion elements are attached to the high temperature-side electrode with a brazing material. Accordingly, the low temperature-side thermoelectric conversion elements can be fixed to the low temperature-side electrode with the solder material, and the high temperature-side thermoelectric conversion elements can be reliably fixed to the high temperature-side electrode with the brazing material.

According to the above-described thermoelectric module, the high temperature-side wiring line extends through the insulating member and is arranged on the side of the low temperature-side member with respect to the insulating member. Accordingly, the high temperature-side wiring line can be arranged at a position away from the high temperature-side member. Therefore, burning of the high temperature-side wiring line can further be restrained.

A thermoelectric power generating apparatus of the present invention includes a plurality of thermoelectric modules described above. The low temperature-side wiring line electrically connects the low temperature-side electrodes of the plurality of thermoelectric modules to each other, and the high temperature-side wiring line electrically connects the high temperature-side electrodes of the plurality of thermoelectric modules to each other. Accordingly, by providing the plurality of thermoelectric modules, the amount of thermoelectric power generation of the thermoelectric power generating apparatus can be increased. Moreover, by electrically connecting the respective low temperature-side electrodes of the plurality of thermoelectric modules to each other and the respective high temperature-side electrodes to each other, suitable voltages can be used on the low temperature side and the high temperature side, respectively.

A thermoelectric generator of the present invention further includes the above-described thermoelectric power generating apparatus, a low-temperature heat transfer medium member, attached to the low temperature-side member of the thermoelectric power generating apparatus, through which a low-temperature heat transfer medium circulates, and a high-temperature heat transfer medium member, attached to the high temperature-side member of the thermoelectric power generating apparatus, through which a high-temperature heat transfer medium circulates. Accordingly, the thermoelectric power generating apparatus can conduct thermoelectric power generation with heat supplied by the low-temperature heat transfer medium member and the high-temperature heat transfer medium member.

The above-described thermoelectric generator further includes a housing surrounding the thermoelectric power generating apparatus, the low-temperature heat transfer medium member and the high-temperature heat transfer medium member. An internal space of the housing is vacuum sealed. Accordingly, oxidization of the high temperature-side thermoelectric conversion elements and the low temperature-side thermoelectric conversion elements that would result in degraded thermoelectric conversion efficiency can be restrained.

Advantageous Effects of Invention

As described above, according to the present invention, burning of wiring lines of a thermoelectric module can be restrained.

DESCRIPTION OF EMBODIMENTS

Hereinafter, embodiments of the present invention will be described based on the drawings.

First Embodiment

A structure of a thermoelectric power generating apparatus according to a first embodiment of the present invention will be described first.

Figure 1:
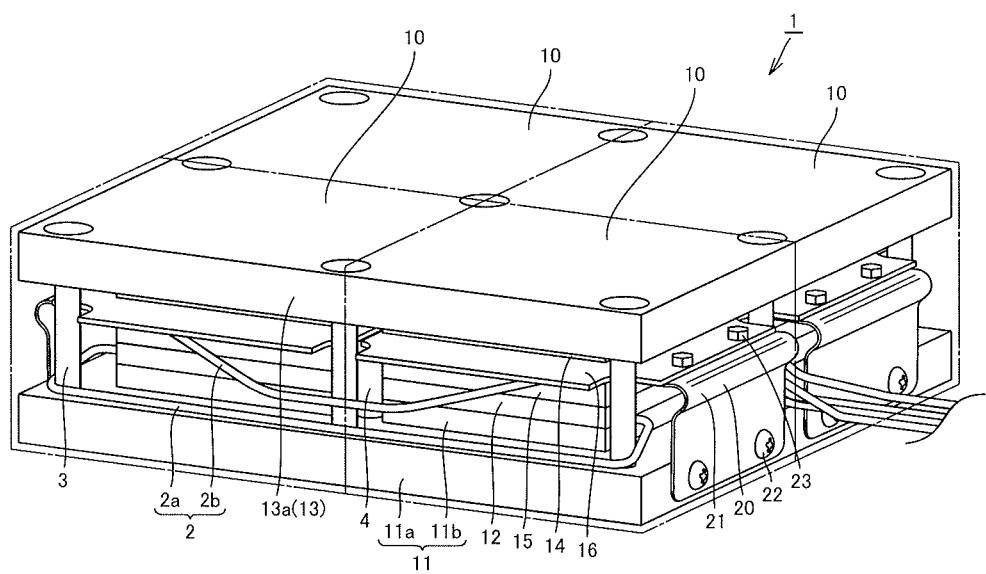
FIG. 1 is a perspective view schematically showing a structure of a thermoelectric power generating apparatus according to a first embodiment of the present invention.
Figure 2:
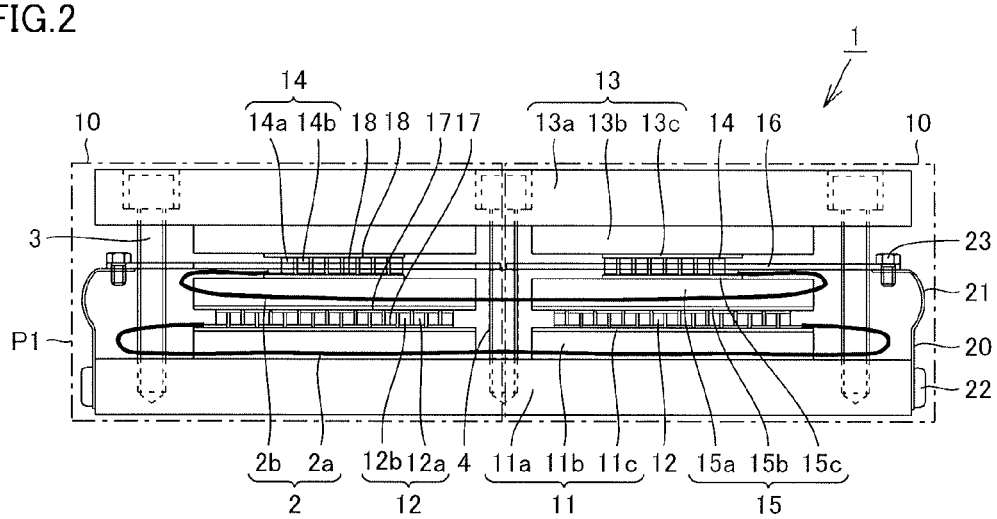
FIG. 2 is a front view schematically showing the structure of the thermoelectric power generating apparatus according to the first embodiment of the present invention.

Referring to FIGS. 1 and 2, a thermoelectric power generating apparatus 1 has a plurality of thermoelectric modules 10. Plurality of thermoelectric modules 10 are intended to convert thermal energy into electrical energy. Plurality of thermoelectric modules 10 are electrically connected to each other with a wiring line 2. Wiring line 2 has a low temperature-side wiring line 2a and a high temperature-side wiring line 2b. Plurality of thermoelectric modules 10 are supported by a screw 3 and a support 4.

Each of plurality of thermoelectric modules 10 has low temperature-side wiring line 2a, high temperature-side wiring line 2b, a low temperature-side member 11, a plurality of low temperature-side thermoelectric conversion elements 12, a high temperature-side member 13, a plurality of high temperature-side thermoelectric conversion elements 14, an insulating member 15, a radiant heat blocking plate 16, a low temperature-side electrode 17, a high temperature-side electrode 18, a thermal circuit member 20, a screw 22, and a bolt 23. In FIG. 1, low temperature-side thermoelectric conversion elements 12 and the like are shown in a simplified manner for ease of understanding.

Low temperature-side member 11 has a low temperature-side plate 11a supporting thermoelectric module 10, a low temperature-side soaking plate 11b made of an insulating material and equalizing heat from low temperature-side plate 11a, and a low temperature-side substrate 11c supporting low temperature-side thermoelectric conversion elements 12. Plurality of low temperature-side thermoelectric conversion elements 12 are arranged on the side of low temperature-side member 11. Plurality of low temperature-side thermoelectric conversion elements 12 are made of a BiTe-based material. Plurality of low temperature-side thermoelectric conversion elements 12 have a p-type thermoelectric semiconductor element 12a and an n-type thermoelectric semiconductor element 12b adjacent to each other.

High temperature-side member 13 is arranged to be opposed to low temperature-side member 11. High temperature-side member 13 has a high temperature-side plate 13a supporting thermoelectric module 10, a high temperature-side soaking plate 13b made of an insulating material and equalizing heat from high temperature-side plate 13a, and a high temperature-side substrate 13c supporting high temperature-side thermoelectric conversion elements 14. Plurality of high temperature-side thermoelectric conversion elements 14 are arranged on the side of high temperature-side member 13 and made of a material different from the BiTe-based material. High temperature-side thermoelectric conversion elements 14 preferably contain one or more kinds of materials selected from the group consisting of a MgSi-based material, a SiGe-based material, a CoSb-based material, and a PbTe-based material. Plurality of high temperature-side thermoelectric conversion elements 14 have a p-type thermoelectric semiconductor element 14a and an n-type thermoelectric semiconductor element 14b adjacent to each other.

Insulating member 15 is sandwiched between low temperature-side thermoelectric conversion elements 12 and high temperature-side thermoelectric conversion elements 14. Insulating member 15 has a central soaking plate 15a, a low temperature-side insulating substrate 15b, and a high temperature-side insulating substrate 15c.

Radiant heat blocking plate 16 is arranged between insulating member 15 and high temperature-side member 13. Radiant heat blocking plate 16 is arranged on the side of high temperature-side member 13 with respect to low temperature-side wiring line 2a and high temperature-side wiring line 2b. Radiant heat blocking plate 16 is arranged between low and high temperature-side wiring lines 2a, 2b and high temperature-side member 13.

Low temperature-side electrode 17 connects plurality of low temperature-side thermoelectric conversion elements 12 electrically in series. Low temperature-side wiring line 2a is electrically connected to low temperature-side electrode 17. High temperature-side electrode 18 connects plurality of high temperature-side thermoelectric conversion elements 14 electrically in series. High temperature-side wiring line 2b is electrically connected to high temperature-side electrode 18.

Thermal circuit member 20 connects radiant heat blocking plate 16 to low temperature-side member 11. Thermal circuit member 20 has a spring member 21. Thermal circuit member 20 has a flexible structure because of spring member 21. Thermal circuit member 20 is attached to low temperature-side member 11 with screw 22, and attached to radiant heat blocking plate 16 with bolt 23.

Figure 3:
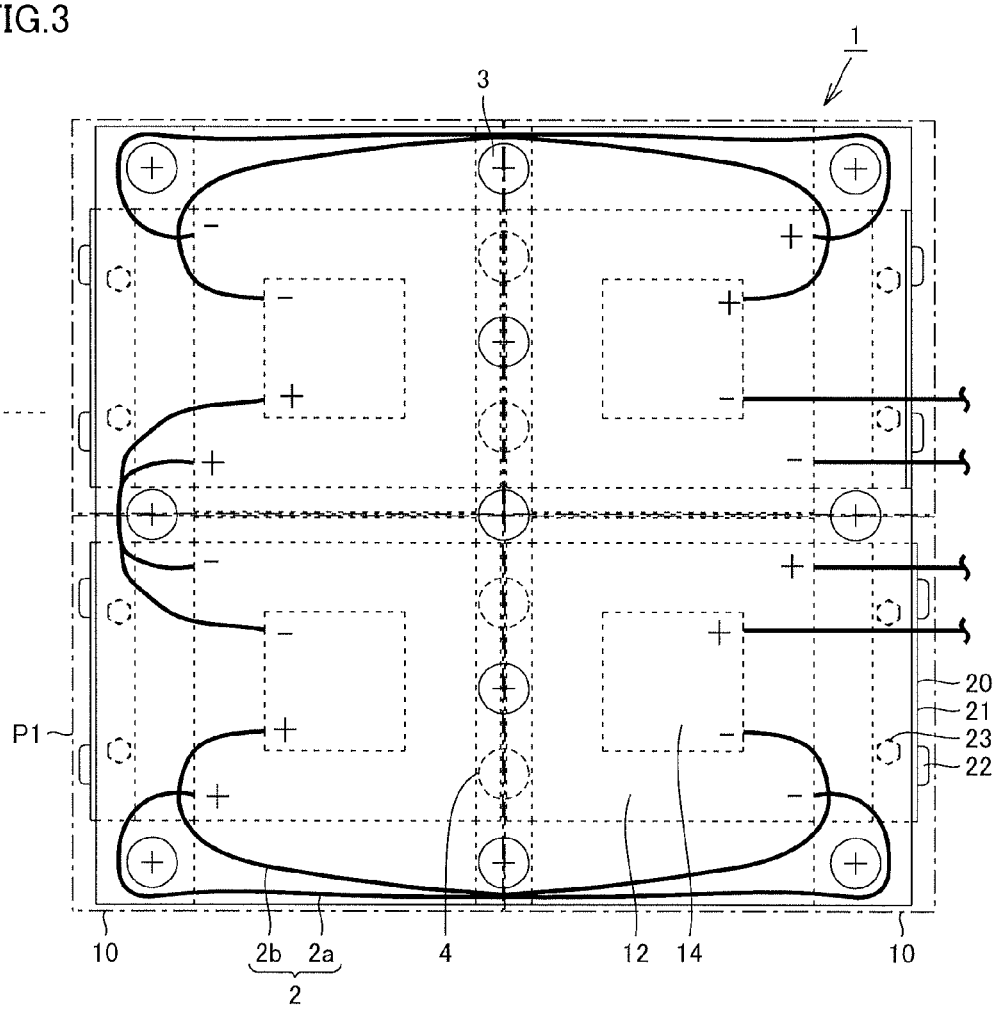
FIG. 3 is a plan view schematically showing the structure of the thermoelectric power generating apparatus according to the first embodiment of the present invention.

Referring to FIGS. 2 and 3, low temperature-side wiring line 2a electrically connects respective low temperature-side electrodes 17 of plurality of thermoelectric modules 10 to each other. High temperature-side wiring line 2b electrically connects respective high temperature-side electrodes 18 of plurality of thermoelectric modules 10 to each other. In FIG. 3, for ease of description, low temperature-side thermoelectric conversion elements 12 and high temperature-side thermoelectric conversion elements 14 are shown in a simplified manner, and low temperature-side wiring line 2a and high temperature-side wiring line 2b are indicated by solid lines.

Figure 4:
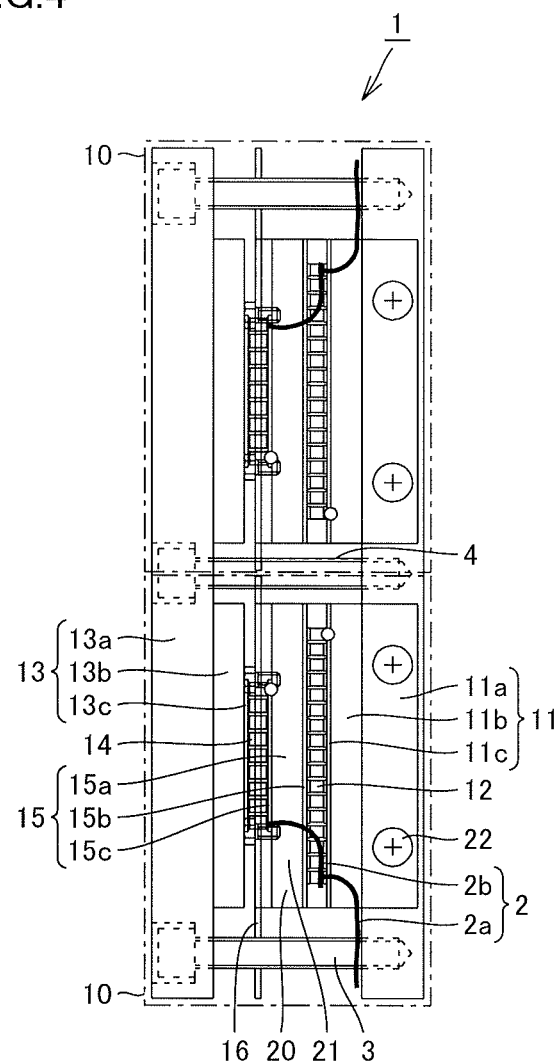
FIG. 4 is a right side view schematically showing the structure of the thermoelectric power generating apparatus according to the first embodiment of the present invention.
Figure 5:
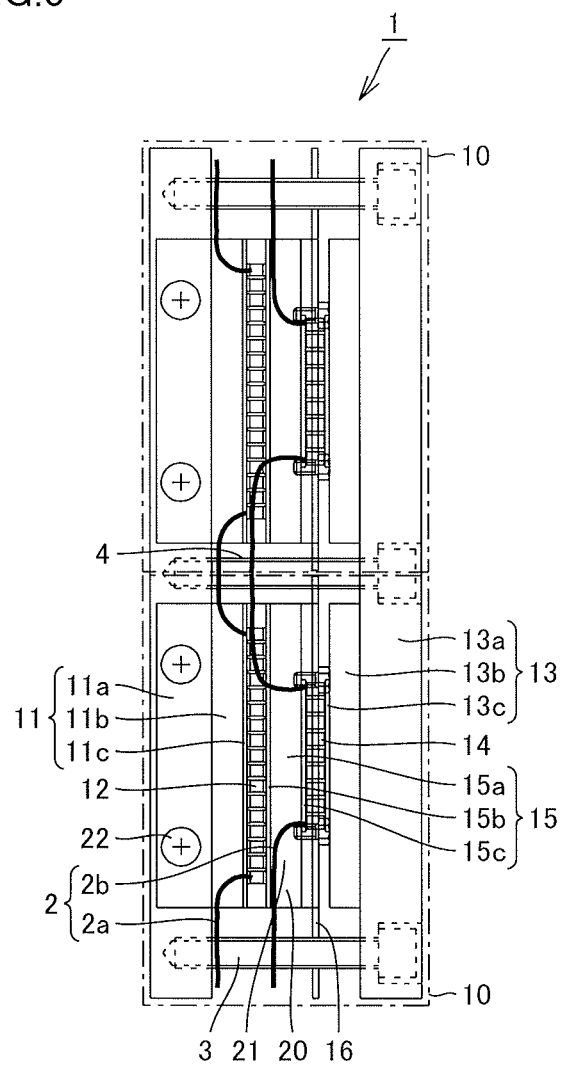
FIG. 5 is a left side view schematically showing the structure of the thermoelectric power generating apparatus according to the first embodiment of the present invention.

Referring to FIGS. 3 to 5, low temperature-side thermoelectric conversion elements 12 and high temperature-side thermoelectric conversion elements 14 of each thermoelectric module 10 of plurality of thermoelectric modules 10 are connected electrically in series to each other. In FIGS. 4 and 5, low temperature-side thermoelectric conversion elements 12, high temperature-side thermoelectric conversion elements 14 and the like are indicated by solid lines for ease of understanding.

In plurality of thermoelectric modules 10, a positive terminal of low temperature-side electrode 17 of each thermoelectric module 10 and a negative terminal of high temperature-side electrode 18 of each thermoelectric module 10 are electrically connected to each other. Accordingly, low temperature-side thermoelectric conversion elements 12 of each thermoelectric module 10 are connected electrically in series to each other. Low temperature-side wiring line 2a electrically connected to the positive terminal of low temperature-side electrode 17 of one thermoelectric module 10 and low temperature-side wiring line 2a electrically connected to the negative terminal of low temperature-side electrode 17 of another thermoelectric module 10 are drawn out to the outside of thermoelectric power generating apparatus 1.

Similarly, high temperature-side thermoelectric conversion elements 14 of each thermoelectric module 10 are connected electrically in series to each other. That is, in plurality of thermoelectric modules 10, the positive terminal of high temperature-side electrode 18 of each thermoelectric module 10 and the negative terminal of high temperature-side electrode 18 of each thermoelectric module 10 are electrically connected to each other. Low temperature-side wiring line 2a electrically connected to the positive terminal of high temperature-side electrode 18 of one thermoelectric module 10 and low temperature-side wiring line 2a electrically connected to the negative terminal of high temperature-side electrode 18 of another thermoelectric module 10 are drawn out to the outside of thermoelectric power generating apparatus 1.

Next, a structure of thermoelectric module 10 will be described in more detail.

Figure 6:
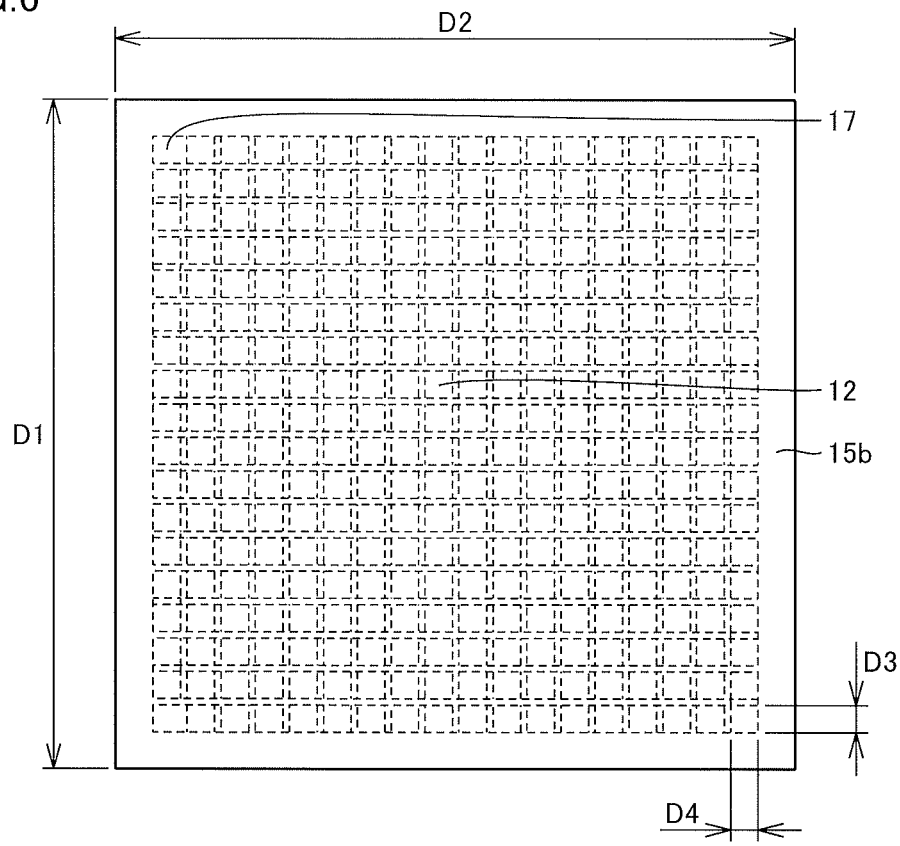
FIG. 6 is a plan view schematically showing a structure of a low temperature-use module in a P1 part in FIGS. 2 and 3.
Figure 7:
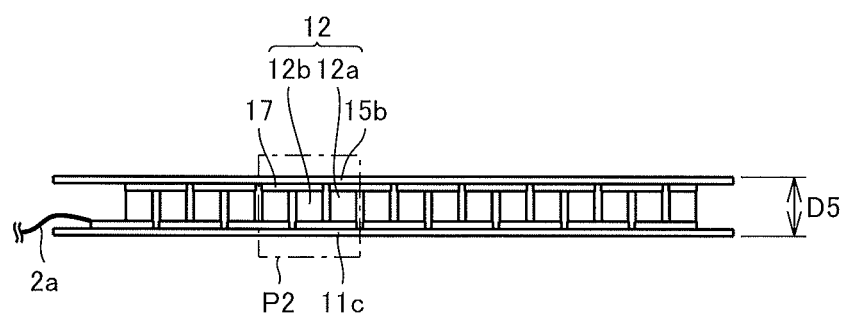
FIG. 7 is a side view schematically showing the structure of the low temperature-use module in P1 part in FIGS. 2 and 3.
Figure 8:
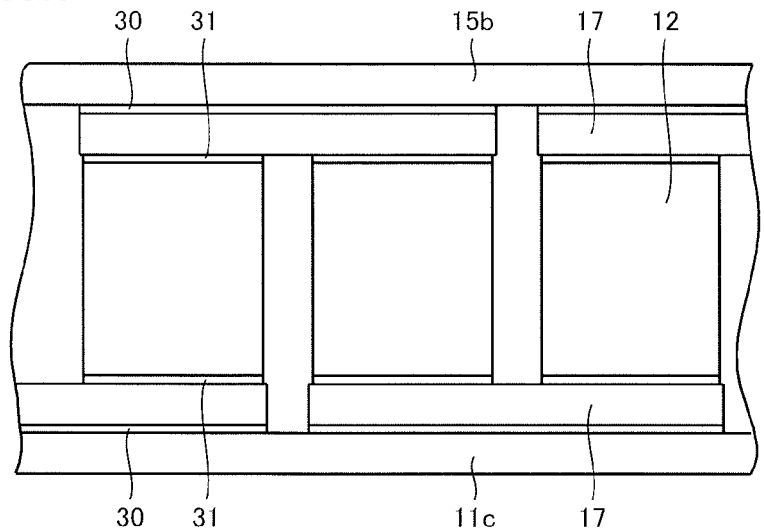
FIG. 8 is an enlarged view of a P2 part in FIG. 7.
Figure 9:
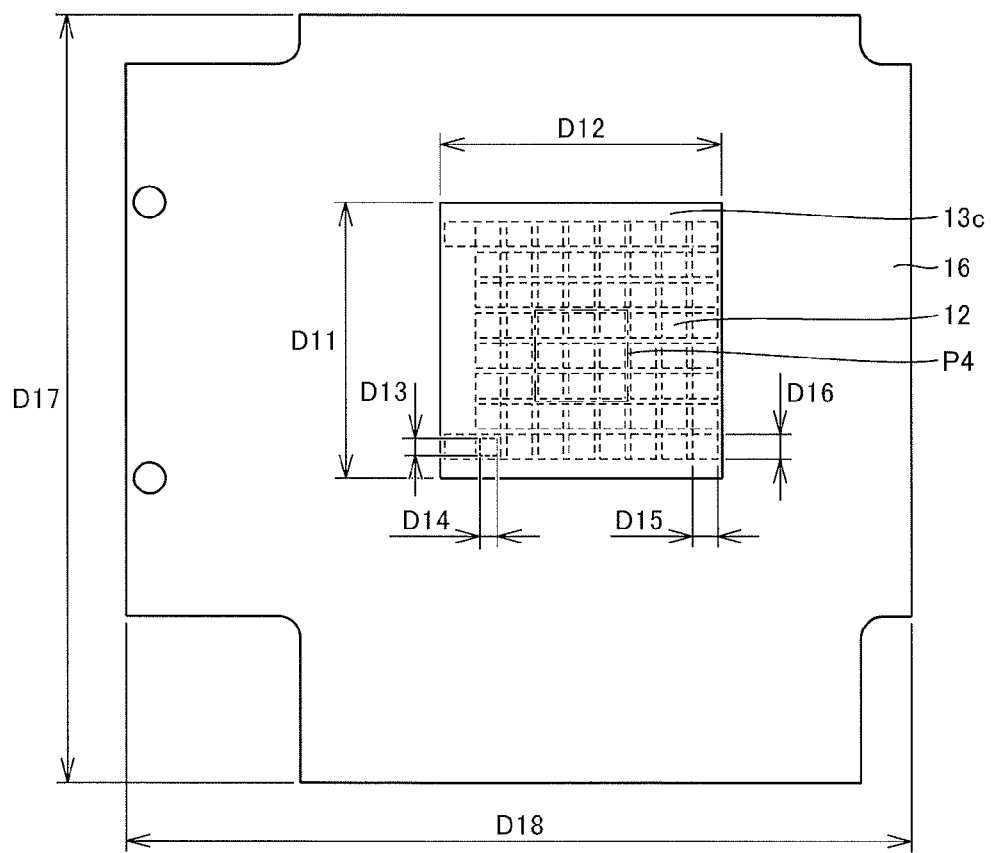
FIG. 9 is a plan view schematically showing a structure of a high temperature-use module in P1 part in FIGS. 2 and 3.
Figure 10:
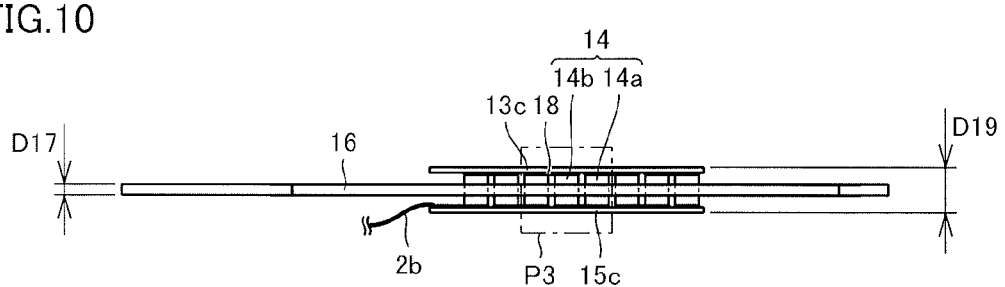
FIG. 10 is a side view schematically showing the structure of the high temperature-use module in P1 part in FIGS. 2 and 3.
Figure 11:
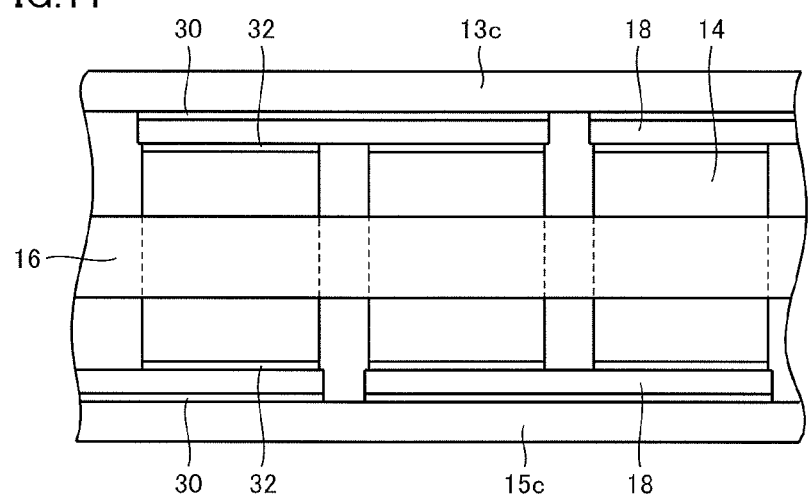
FIG. 11 is an enlarged view of a P3 part in FIG. 10.
Figure 12:
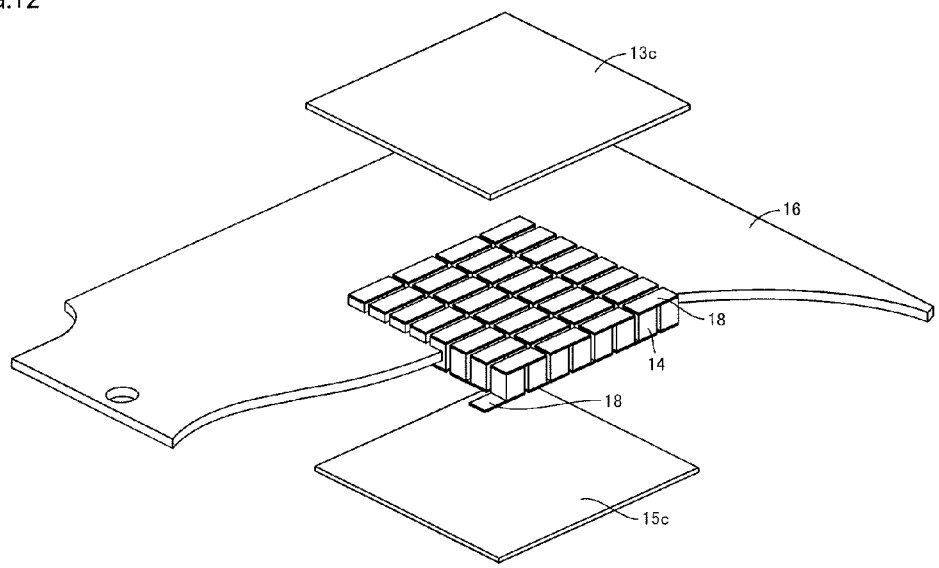
FIG. 12 is an exploded perspective view schematically showing the structure of the high temperature-use module in P1 part in FIGS. 2 and 3.
Figure 13:
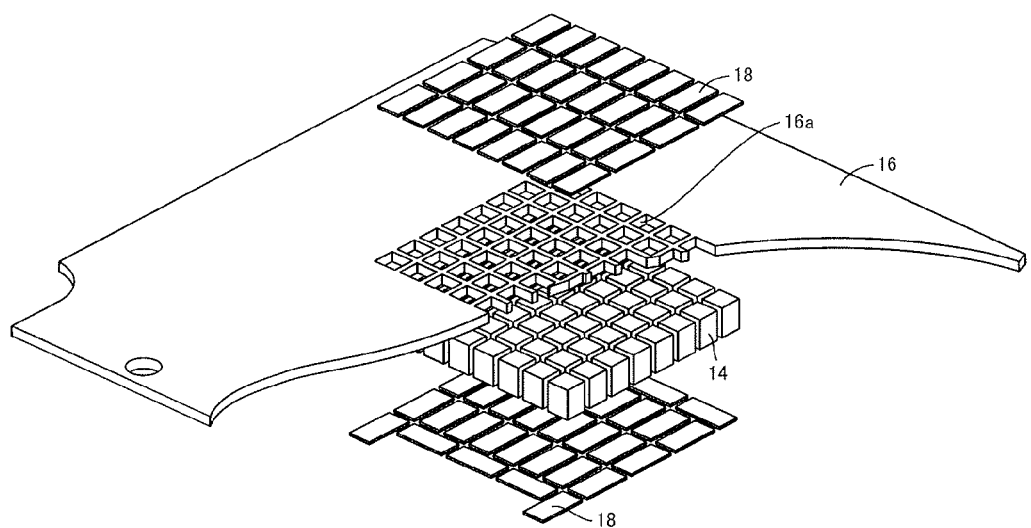
FIG. 13 is an exploded perspective view schematically showing the structure of the neighborhood of high temperature-side thermoelectric conversion elements in FIG. 12.

Referring to FIGS. 6 to 8, a low temperature-use module of thermoelectric module 10 is configured to be joined such that p-type thermoelectric semiconductor elements 12a and n-type thermoelectric semiconductor elements 12b made of a BiTe-based material are connected electrically in series alternately between low temperature-side substrate 11c and low temperature-side insulating substrate 15b. Low temperature-side substrate 11c and low temperature-side insulating substrate 15b are made of, for example, alumina and aluminum nitride, or the like.

On the upper surface of low temperature-side substrate 11c, low temperature-side electrode 17 is arranged with a thermal conductive grease 30 interposed therebetween. A pair of p-type thermoelectric semiconductor element 12a and n-type thermoelectric semiconductor element 12b is mounted on each independent part of low temperature-side electrode 17 with a solder material 31 interposed therebetween. Similar low temperature-side electrode 17 is also arranged on the lower surface of low temperature-side insulating substrate 15b with thermal conductive grease 30 interposed therebetween.

Low temperature-side electrode 17 on low temperature-side insulating substrate 15b is offset relatively from low temperature-side electrode 17 on low temperature-side substrate 11c. As a result, plurality of p-type thermoelectric semiconductor elements 12a and n-type thermoelectric semiconductor elements 12b joined between a plurality of parts of low temperature-side electrode 17 on low temperature-side insulating substrate 15b and a plurality of parts of low temperature-side electrode 17 on low temperature-side substrate 11c with solder material 31 interposed therebetween are connected electrically in series alternately.

On low temperature-side substrate 11c, one low temperature-side wiring line 2a is attached with a solder material to a part of low temperature-side electrode 17 on which only one p-type thermoelectric semiconductor element 12a is mounted so as to supply electric power from thermoelectric module 10.

Low temperature-side substrate 11c and low temperature-side insulating substrate 15b each have a length D1 and a width D2 of 50 mm, for example. P-type thermoelectric semiconductor elements 12a and n-type thermoelectric semiconductor elements 12b each have a length D3 and a width D4 of 1.95 mm, for example. The low temperature-use module of thermoelectric module 10 has a height of 4.2 mm, for example.

Referring to FIGS. 9 to 13, a high temperature-use module of thermoelectric module 10 is configured to be joined such that p-type thermoelectric semiconductor elements 14a and n-type thermoelectric semiconductor elements 14b made of a material different from a BiTe-based material are connected electrically in series alternately between high temperature-side substrate 13c and high temperature-side insulating substrate 15c. High temperature-side substrate 13c and high temperature-side insulating substrate 15c are made of, for example, alumina and aluminum nitride, or the like.

On the upper surface of high temperature-side substrate 13c, high temperature-side electrode 18 is arranged with thermal conductive grease 30 interposed therebetween. A pair of p-type thermoelectric semiconductor element 14a and n-type thermoelectric semiconductor element 14b is mounted on each independent part of high temperature-side electrode 18 with a brazing material 32 interposed therebetween. Similar high temperature-side electrode 18 is also arranged on the lower surface of high temperature-side insulating substrate 15c with thermal conductive grease 30 interposed therebetween.

High temperature-side electrode 18 on high temperature-side insulating substrate 15c is offset relatively from high temperature-side electrode 18 on high temperature-side substrate 13c. As a result, plurality of p-type thermoelectric semiconductor elements 14a and n-type thermoelectric semiconductor elements 14b joined between a plurality of parts of high temperature-side electrode 18 on high temperature-side insulating substrate 15c and a plurality of parts of high temperature-side electrode 18 on high temperature-side substrate 13c with brazing material 32 interposed therebetween are connected electrically in series alternately.

On high temperature-side substrate 13c, one high temperature-side wiring line 2b is attached with a brazing material to a part of high temperature-side electrode 18 on which only one p-type thermoelectric semiconductor element 14a is mounted so as to supply electric power from thermoelectric module 10.

Radiant heat blocking plate 16 is arranged between high temperature-side substrate 13c and high temperature-side insulating substrate 15c. Radiant heat blocking plate 16 has a plurality of through-holes 16a. Radiant heat blocking plate 16 has a lattice-like frame formed by plurality of through-holes 16a. P-type thermoelectric semiconductor elements 14a and n-type thermoelectric semiconductor elements 14b are inserted in plurality of through-holes 16a, respectively.

High temperature-side substrate 13c and high temperature-side insulating substrate 15c each have a length D11 and a width D12 of 25 mm, for example. P-type thermoelectric semiconductor elements 12a and n-type thermoelectric semiconductor elements 12b each have a length D13 and a width D14 of 2.15 mm, for example. Radiant heat blocking plate 16 has a length D17 of 69.5 mm and a width D18 of 70.0 mm, for example. Plurality of through-holes 16a of radiant heat blocking plate 16 each have a length D15 and a width D16 of 2.35 mm, for example. The high temperature-use module of thermoelectric module 10 has a height of 4.2 mm, for example.

Figure 14:
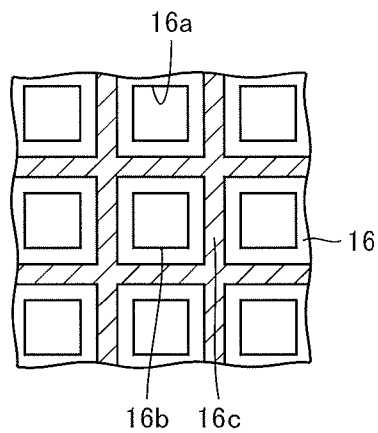
FIG. 14 is an enlarged view schematically showing an example of a P4 part in FIG. 9.

Referring to FIG. 14, radiant heat blocking plate 16 may have an insulating substrate 16b and a covering part 16c. Covering part 16c covers at least part of a surface of insulating substrate 16b on the side of high temperature-side member 13. Covering part 16c is formed between plurality of through-holes 16a, but not formed in through-holes 16a. Covering part 16c is made of a coating or plating having high heat reflectivity, for example. As the material of covering part 16c, Ag (silver), Au (gold), Cr (chromium), Ni (nickel), Pt (platinum), Sn (tin), aluminum oxide, or the like is preferable.

In thermoelectric power generating apparatus 1 of the present embodiment, by applying low-temperature heat to low temperature-side member 11 of thermoelectric module 10 and applying high temperature heat to high temperature-side member 13, electromotive force is produced at each of low temperature-side thermoelectric conversion elements 12 and high temperature-side thermoelectric conversion elements 14, so that current flows into each of low temperature-side wiring line 2a and high temperature-side wiring line 2b. That is, electric power is drawn out by the temperature difference between the high temperature side and low temperature side of thermoelectric module 10.

Figure 15:
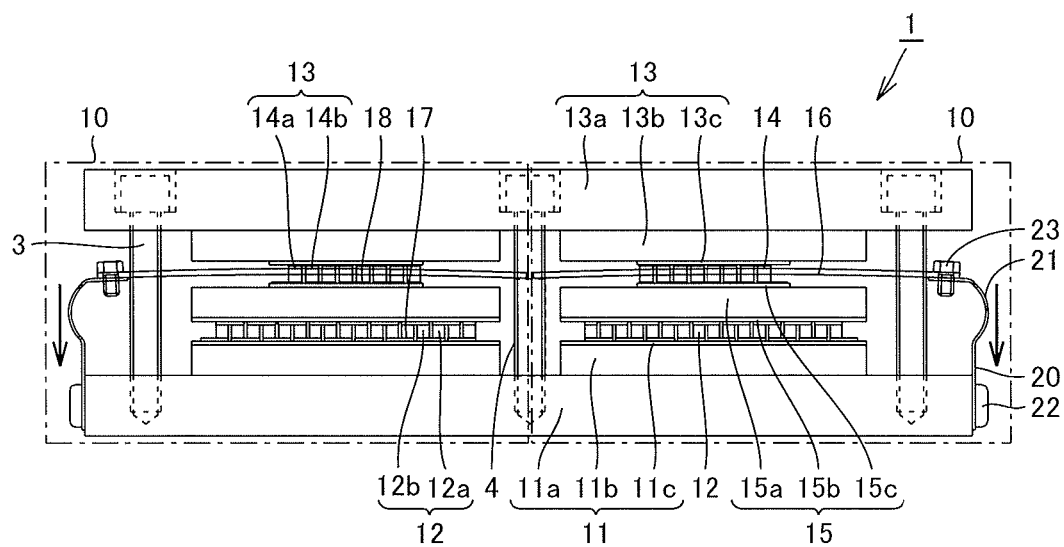
FIG. 15 is a front view schematically showing a state where a radiant heat blocking plate of the thermoelectric power generating apparatus according to the first embodiment of the present invention has been deformed.
Figure 16:
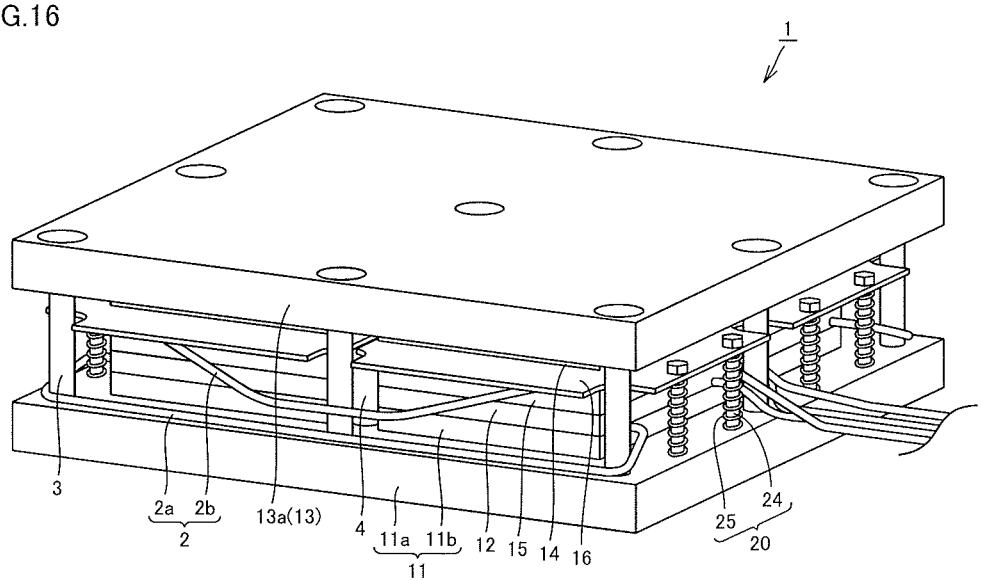
FIG. 16 is a perspective view schematically showing a structure of a thermoelectric power generating apparatus according to a second embodiment of the present invention.
Figure 17:
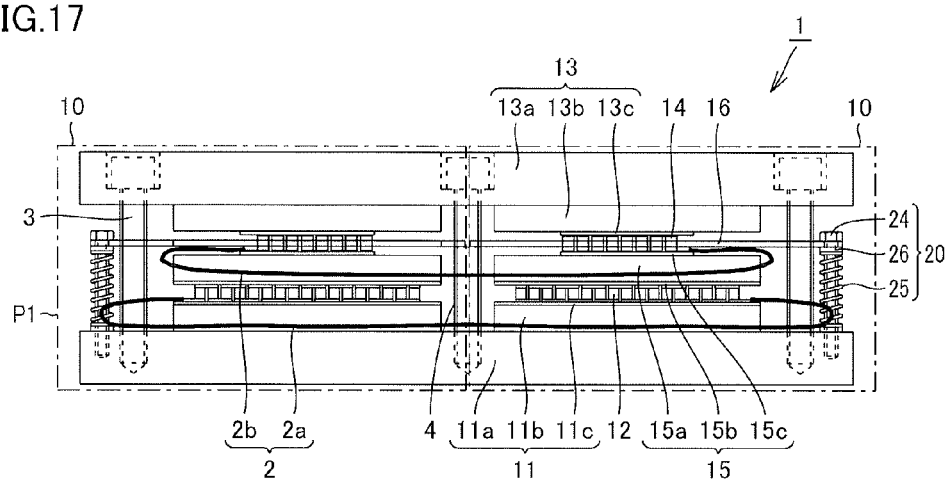
FIG. 17 is a front view schematically showing the structure of the thermoelectric power generating apparatus according to the second embodiment of the present invention.
Figure 18:
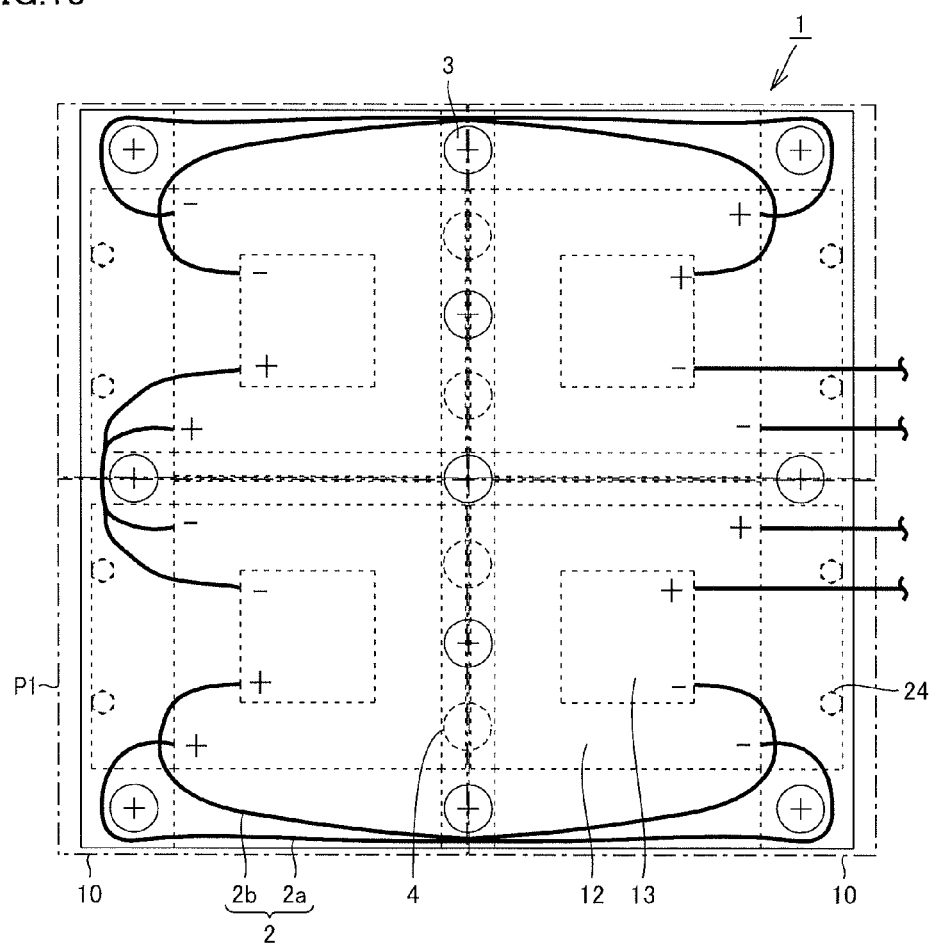
FIG. 18 is a plan view schematically showing the structure of the thermoelectric power generating apparatus according to the second embodiment of the present invention.
Figure 19:
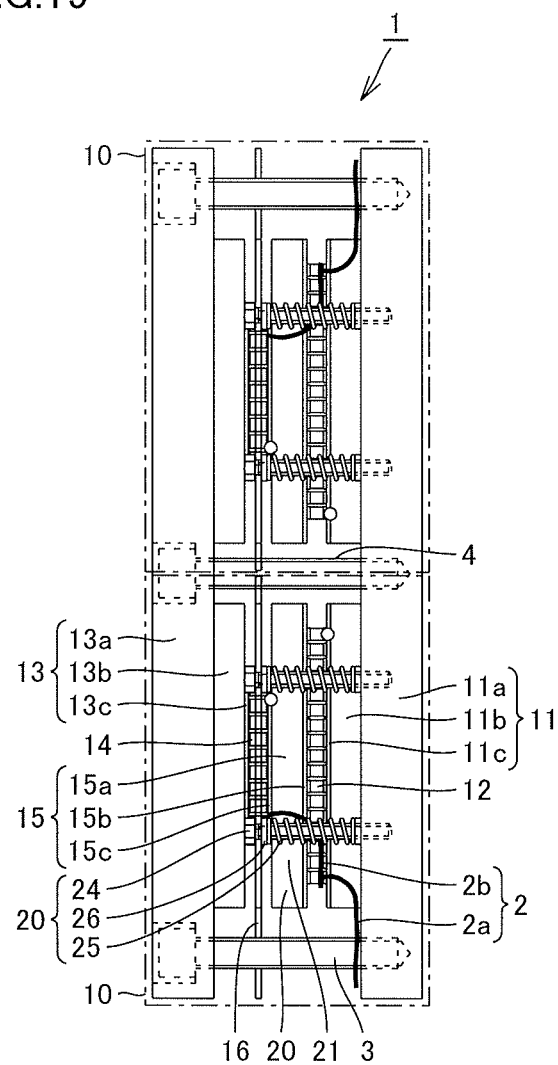
FIG. 19 is a right side view schematically showing the structure of the thermoelectric power generating apparatus according to the second embodiment of the present invention.

Referring to FIG. 15, on this occasion, the high temperature side is extended by heat more greatly than the low temperature side. That is, the high temperature side is thermally deformed more greatly than the low temperature side. High temperature-side member 13 is extended more greatly than low temperature-side member 11. Radiant heat blocking plate 16 is also extended more greatly than low temperature-side member 11. Therefore, radiant heat blocking plate 16 is deformed into a convex shape toward high temperature-side member 13. Thermal circuit member 20 attached to radiant heat blocking plate 16 is elastically deformed because of spring member 21. In the present embodiment, spring member 21 of thermal circuit member 20 is deformed toward low temperature-side member 11 in accordance with thermal deformation of radiant heat blocking plate 16. Accordingly, thermal stress produced in thermal circuit member 20 is reduced.

Next, functions and effects of the present embodiment will be described.

According to thermoelectric module 10 of the present embodiment, insulating member 15 is sandwiched between plurality of low temperature-side thermoelectric conversion elements 12 made of a BiTe-based material and plurality of high temperature-side thermoelectric conversion elements 14 made of a material different from the BiTe-based material. Radiant heat blocking plate 16 is arranged between insulating member 15 and high temperature-side member 13, and arranged on the side of high temperature-side member 13 with respect to low temperature-side wiring line 2a and high temperature-side wiring line 2b. Accordingly, in cascade-type thermoelectric module 10 having plurality of low temperature-side thermoelectric conversion elements 12 and plurality of high temperature-side thermoelectric conversion elements 14, burning of high temperature-side wiring line 2b can be restrained by blocking radiant heat from high temperature-side member 13 with radiant heat blocking plate 16.

Since thermoelectric module 10 has thermal circuit member 20 connecting radiant heat blocking plate 16 to low temperature-side member 11, radiant heat blocking plate 16 can be restrained from rising in temperature by transfer of heat of radiant heat blocking plate 16 to low temperature-side member 11 through thermal circuit member 20. Therefore, burning of high temperature-side wiring line 2b due to radiant heat from radiant heat blocking plate 16 can be restrained.

Since thermal circuit member 20 has spring member 21, thermal stress produced in thermal circuit member 20 due to thermal deformation of radiant heat blocking plate 16 can be restrained by elastic deformation of spring member 21. Therefore, breakdown of thermal circuit member 20 can be restrained.

Since low temperature-side member 11 has low temperature-side plate 11a connected to thermal circuit member 20, radiant heat blocking plate 16 can be restrained from rising in temperature by transfer of heat of radiant heat blocking plate 16 to low temperature-side plate 11a through thermal circuit member 20.

Since low temperature-side member 11 has low temperature-side soaking plate 11b sandwiched between plurality of low temperature-side thermoelectric conversion elements 12 and low temperature-side plate 11a, the distribution of heat from low temperature-side plate 11a can be made uniform by low temperature-side soaking plate 11b.

Since radiant heat blocking plate 16 has insulating substrate 16b and covering part 16c covering at least part of the surface of insulating substrate 16b on the side of high temperature-side member 13, insulation from high temperature-side thermoelectric conversion elements 14 can be ensured by insulating substrate 16b, and radiant heat from high temperature-side member 13 can be reflected by covering part 16c.

High temperature-side thermoelectric conversion elements 14 contain one or more kinds of materials selected from the group consisting of a MgSi (magnesium silicon)-based material, a SiGe (silicon germanium)-based material, a CoSb (cobalt antimony)-based material, and a PbTe (lead tellurium)-based material. Accordingly, they can each be used in a temperature range where high thermoelectric conversion efficiency is exhibited, so that thermoelectric conversion efficiency can be improved.

The low temperature-side thermoelectric conversion elements are attached to the low temperature-side electrode with the solder material, and the high temperature-side thermoelectric conversion elements are attached to the high temperature-side electrode with the brazing material. Accordingly, low temperature-side thermoelectric conversion elements 12 can be fixed to low temperature-side electrode 17 with solder material 31, and high temperature-side thermoelectric conversion elements 14 can be reliably fixed to high temperature-side electrode 18 with brazing material 32.

Thermoelectric power generating apparatus 1 of the present embodiment includes a plurality of thermoelectric modules 10. Low temperature-side wiring line 2a electrically connects respective low temperature-side electrodes 17 of plurality of thermoelectric modules 10 to each other, and high temperature-side wiring line 2b electrically connects respective high temperature-side electrodes 18 of plurality of thermoelectric modules 10 to each other. Accordingly, by providing plurality of thermoelectric modules 10, the amount of thermoelectric power generation of thermoelectric power generating apparatus 1 can be increased. By electrically connecting respective low temperature-side electrodes 17 of plurality of thermoelectric modules 10 to each other and high temperature-side electrodes 18 to each other, suitable voltages can be used on the low temperature side and the high temperature side, respectively.

Second Embodiment

In a second embodiment of the present invention, thermal circuit member 20 has a different structure from that of the first embodiment. Referring to FIGS. 16 to 19, in thermoelectric power generating apparatus 1 of the present embodiment, thermal circuit member 20 has a bolt 24 and a coil spring 25. Thermal circuit member 20 may have a washer 26. In the present embodiment, bolt 24 is inserted in a through-hole of radiant heat blocking plate 16, as well as washer 26 arranged on the lower surface of radiant heat blocking plate 16 and washer 26 arranged on the upper surface of low temperature-side plate 11a.

Bolt 24 is fixed to low temperature-side plate 11a with its leading end screwed into low temperature-side plate 11a. Coil spring 25 is located between washer 26 arranged on the lower surface of radiant heat blocking plate 16 and washer 26 arranged on the upper surface of low temperature-side plate 11a.

Since the remaining structure of the present embodiment is similar to the structure of the above-described first embodiment, the same element has the same reference character allotted, and description thereof will not be repeated.

In thermoelectric module 10 of the present embodiment, by applying low-temperature heat to low temperature-side member 11 and applying high temperature heat to high temperature-side member 13, radiant heat blocking plate 16 is deformed into a convex shape toward high temperature-side member 13. On this occasion, in accordance with thermal deformation of radiant heat blocking plate 16, coil spring 25 is elastically deformed in a manner contracting along bolt 24. Accordingly, thermal stress produced in thermal circuit member 20 can be restrained. Therefore, breakdown of thermal circuit member 20 can be restrained.

Third Embodiment

Figure 20:
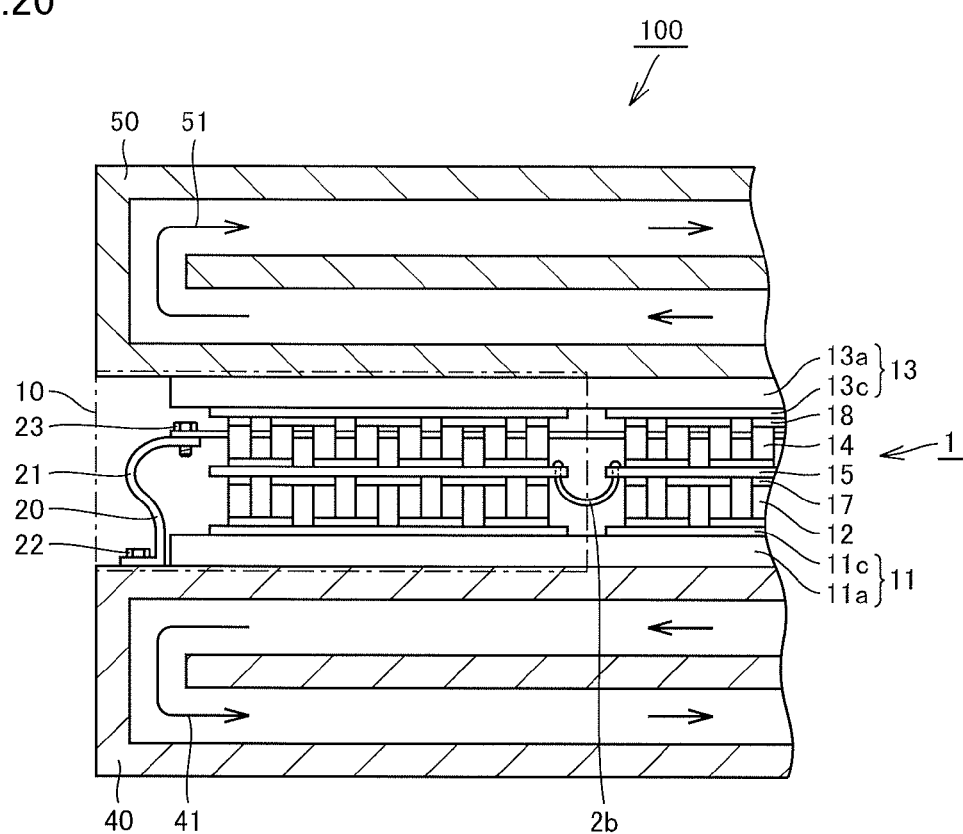
FIG. 20 is a partial front view schematically showing a structure of a thermoelectric generator according to a third embodiment of the present invention.

Referring to FIG. 20, a thermoelectric generator 100 of a third embodiment of the present invention has thermoelectric power generating apparatus 1, a low-temperature heat transfer medium member 40, and a high-temperature heat transfer medium member 50. Low-temperature heat transfer medium member 40 is attached to low temperature-side member 11 of thermoelectric power generating apparatus 1. In the present embodiment, low-temperature heat transfer medium member 40 is attached to low temperature-side plate 11a. A low-temperature heat transfer medium 41 circulates through low-temperature heat transfer medium member 40. As low-temperature heat transfer medium 41, vapor may be adopted, for example. Low-temperature heat transfer medium 41 has a temperature more than or equal to 140° C. and less than or equal to 170° C., for example.

High-temperature heat transfer medium member 50 is attached to high temperature-side member 13 of thermoelectric power generating apparatus 1. In the present embodiment, high-temperature heat transfer medium member 50 is attached to high temperature-side plate 13a. A high-temperature heat transfer medium 51 circulates through high-temperature heat transfer medium member 50. As high-temperature heat transfer medium 51, molten salt may be adopted, for example. High-temperature heat transfer medium 51 has a temperature more than or equal to 550° C., for example. Insulating member 15 has a temperature on the order of about 280° C., for example.

Thermal circuit member 20 is attached to low-temperature heat transfer medium member 40. Thermal circuit member 20 may be attached to low temperature-side plate 11a.

High temperature-side wiring line 2b extends through each of insulating members 15 of plurality of thermoelectric modules 10 and runs on the side of low temperature-side member 11 with respect to insulating member 15 to electrically connect respective high temperature-side electrodes 18 of plurality of thermoelectric modules 10 to each other. High temperature-side wiring line 2b extends through insulating member 15 and is located on the side of low temperature-side member 11 with respect to insulating member 15.

Since the remaining structure of the present embodiment is similar to the structure of the above-described first embodiment, the same element has the same reference character allotted, and description thereof will not be repeated.

Thermoelectric generator 100 of the present embodiment further includes low-temperature heat transfer medium member 40, attached to low temperature-side member 11 of thermoelectric power generating apparatus 1, through which low-temperature heat transfer medium 41 circulates, and high-temperature heat transfer medium member 50, attached to high temperature-side member 13 of thermoelectric power generating apparatus 1, through which high-temperature heat transfer medium 51 circulates. Accordingly, thermoelectric power generating apparatus 1 can conduct thermoelectric power generation with heat supplied by low-temperature heat transfer medium member 40 and high-temperature heat transfer medium member 50.

High temperature-side wiring line 2b extends through insulating member 15 and is located on the side of low temperature-side member 11 with respect to insulating member 15. Accordingly, high temperature-side wiring line 2b can be arranged at a position away from high temperature-side member 13. Therefore, burning of the high temperature-side wiring line 2b can further be restrained.

Fourth Embodiment

Figure 21:
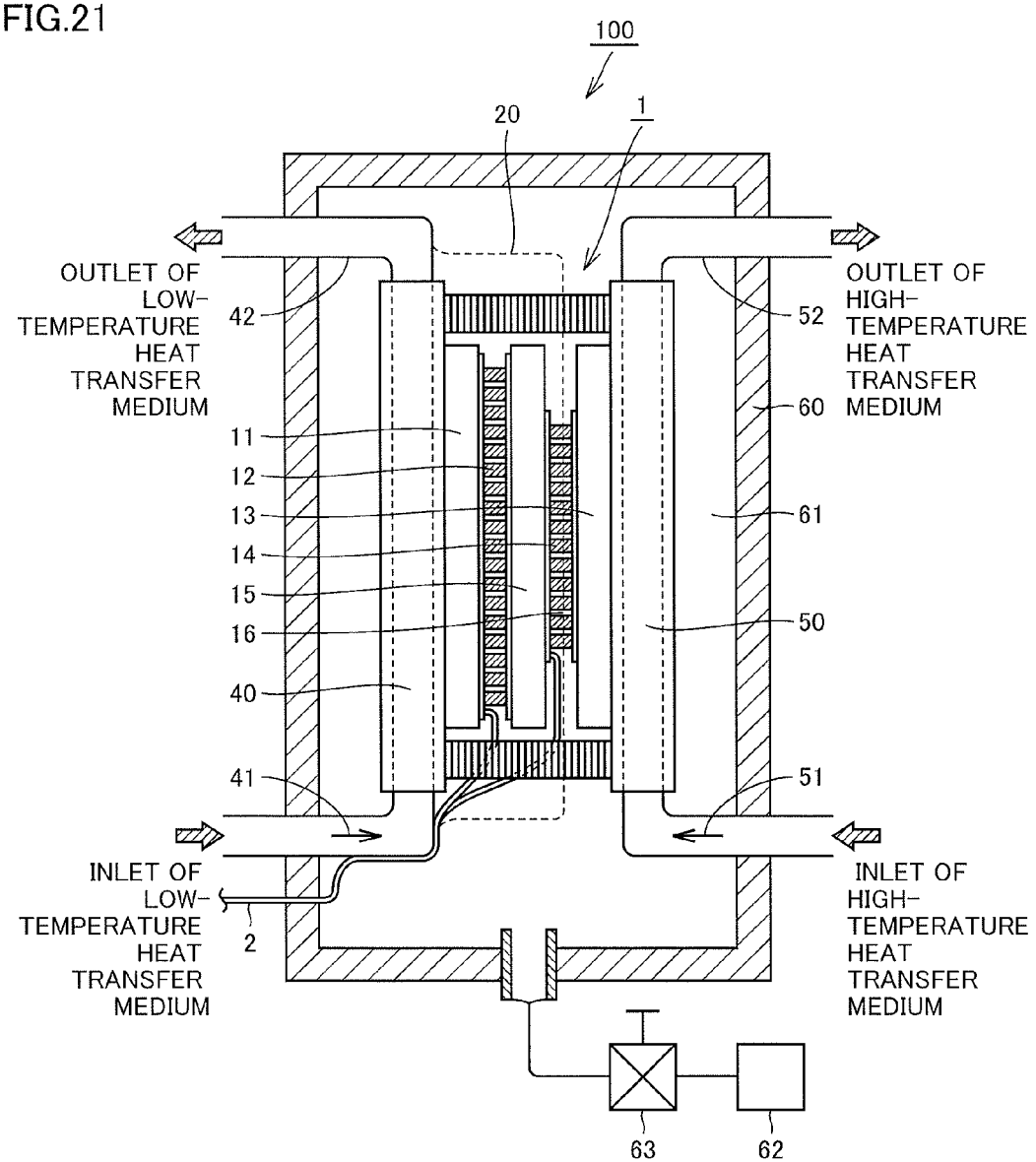
FIG. 21 is a cross-sectional view schematically showing a structure of a thermoelectric generator according to a fourth embodiment of the present invention.

Referring to FIG. 21, thermoelectric generator 100 of a fourth embodiment of the present invention has thermoelectric power generating apparatus 1, low-temperature heat transfer medium member 40, high-temperature heat transfer medium member 50, a housing 60, a vacuum pump 62, and a valve 63.

Thermoelectric power generating apparatus 1, low-temperature heat transfer medium member 40 and high-temperature heat transfer medium member 50 are surrounded by housing 60. Thermoelectric power generating apparatus 1, low-temperature heat transfer medium member 40 and high-temperature heat transfer medium member 50 are stored in an internal space 61 of housing 60. Internal space 61 of housing 60 is evacuated through valve 63 by vacuum pump 62. Accordingly, internal space 61 of housing 60 is vacuum sealed. That is, internal space 61 of housing 60 has a pressure lower than an atmospheric pressure.

A low temperature-side pipe 42 supplying low-temperature heat transfer medium 41 to low-temperature heat transfer medium member 40 is pulled out from internal space 61 of housing 60 to the outside. A device not shown but supplying low-temperature heat transfer medium 41 causes low-temperature heat transfer medium 41 to circulate through low-temperature heat transfer medium member 40. Similarly, a high temperature-side pipe 52 supplying high-temperature heat transfer medium 51 to high-temperature heat transfer medium member 50 is pulled out from internal space 61 of housing 60 to the outside. A device not shown but supplying high-temperature heat transfer medium 51 causes high-temperature heat transfer medium 51 to circulate through high-temperature heat transfer medium member 50. High temperature-side wiring line 2b is also pulled out from internal space 61 of housing 60 to the outside. Although low temperature-side pipe 42, high temperature-side pipe 52 and wiring line 2 are pulled out from internal space 61 of housing 60 to the outside, internal space 61 is held in a vacuum sealed state.

Since the remaining structure of the present embodiment is similar to the structure of the above-described first embodiment, the same element has the same reference character allotted, and description thereof will not be repeated.

According to thermoelectric generator 100 of the present embodiment, internal space 61 of housing 60 surrounding thermoelectric power generating apparatus 1, low-temperature heat transfer medium member 40 and high-temperature heat transfer medium member 50 is vacuum sealed. Accordingly, oxidization of high temperature-side thermoelectric conversion elements 14 and low temperature-side thermoelectric conversion elements 12 that would result in degraded thermoelectric conversion efficiency can be restrained.

Fifth Embodiment

A fifth embodiment of the present invention is different from the first embodiment in that a plurality of thermoelectric semiconductor elements are electrically connected in parallel.

Figure 22:
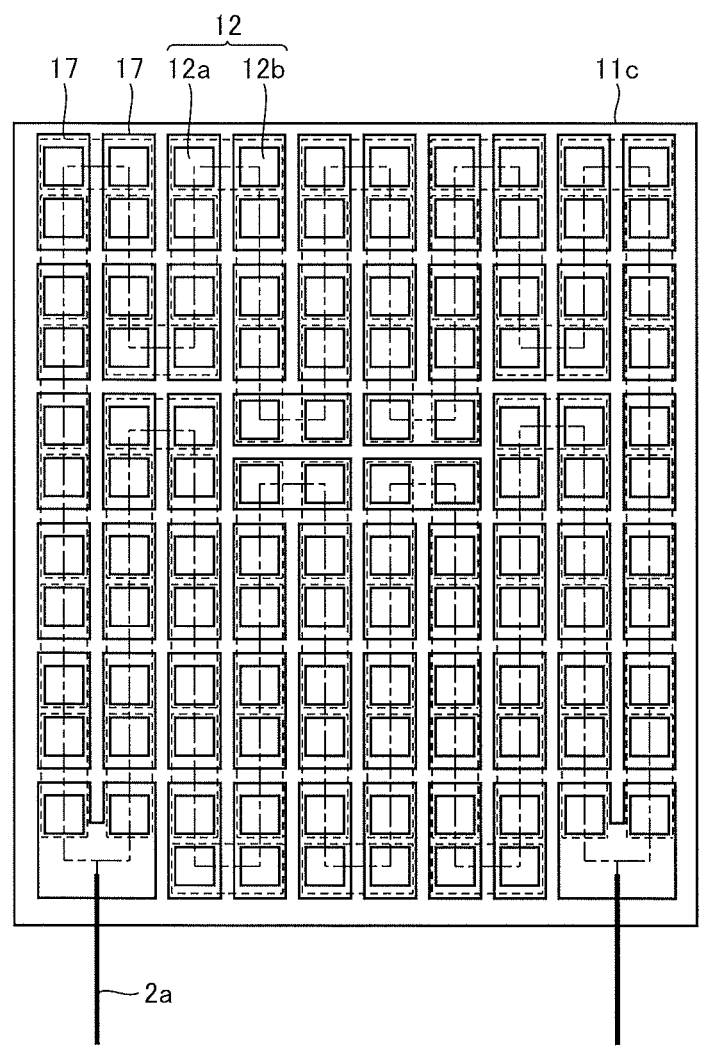
FIG. 22 is a plan view schematically showing a structure of a low temperature-use module according to a fifth embodiment of the present invention.

Referring to FIG. 22, in the low temperature-use module of the thermoelectric module of the present embodiment, p-type thermoelectric semiconductor elements 12a and low temperature-side wiring line 2a are arranged to be sandwiched between low temperature-side electrodes 17 between low temperature-side substrate 11c and a low temperature-side insulating substrate not shown. In FIG. 22, the low temperature-side insulating substrate and the like are not shown for ease of description, and low temperature-side electrode 17 on the side of the low temperature-side insulating substrate is indicated by broken lines.

Two p-type thermoelectric semiconductor elements 12a and low temperature-side wiring line 2a are arranged on one end of low temperature-side electrode 17, and two n-type thermoelectric semiconductor elements 12b and low temperature-side wiring line 2a are arranged on the other end of low temperature-side electrode 17. A central section of low temperature-side electrode 17 is located between the one end and the other end of low temperature-side electrode 17. This central section of low temperature-side electrode 17 is configured to have independent parts, and a pair of p-type thermoelectric semiconductor element 12a and n-type thermoelectric semiconductor element 12b is mounted on each part of low temperature-side electrode 17.

Two p-type thermoelectric semiconductor elements 12a mounted on the one end of low temperature-side electrode 17 are each connected to n-type thermoelectric semiconductor element 12b arranged on another part of the central section of low temperature-side electrode 17 with a part of low temperature-side electrode 17 indicated by broken lines. Similarly, two n-type thermoelectric semiconductor elements 12b mounted on the other end of low temperature-side electrode 17 are each connected to p-type thermoelectric semiconductor element 12a arranged on another part of the central section of low temperature-side electrode 17 with a part of low temperature-side electrode 17 indicated by broken lines.

P-type thermoelectric semiconductor element 12a located on the outer side of the one end of low temperature-side electrode 17, n-type thermoelectric semiconductor element 12b located on the outer side of the other end of low temperature-side electrode 17, and p-type thermoelectric semiconductor element 12a and n-type thermoelectric semiconductor element 12b located on the central section of low temperature-side electrode 17 are thereby electrically connected to each other with low temperature-side electrode 17. An external circuit is thus formed. P-type thermoelectric semiconductor element 12a located on the inner side of the one end of low temperature-side electrode 17, n-type thermoelectric semiconductor element 12b located on the inner side of the other end of low temperature-side electrode 17, and p-type thermoelectric semiconductor element 12a and n-type thermoelectric semiconductor element 12b located on the central section of low temperature-side electrode 17 are electrically connected to each other. An internal circuit is thus formed. On the one end and the other end of low temperature-side electrode 17, the external circuit and the internal circuit are connected electrically in parallel. That is, low temperature-side electrode 17 connects plurality of p-type thermoelectric semiconductor elements 12a and n-type thermoelectric semiconductor elements 12b electrically in parallel.

Figure 23:
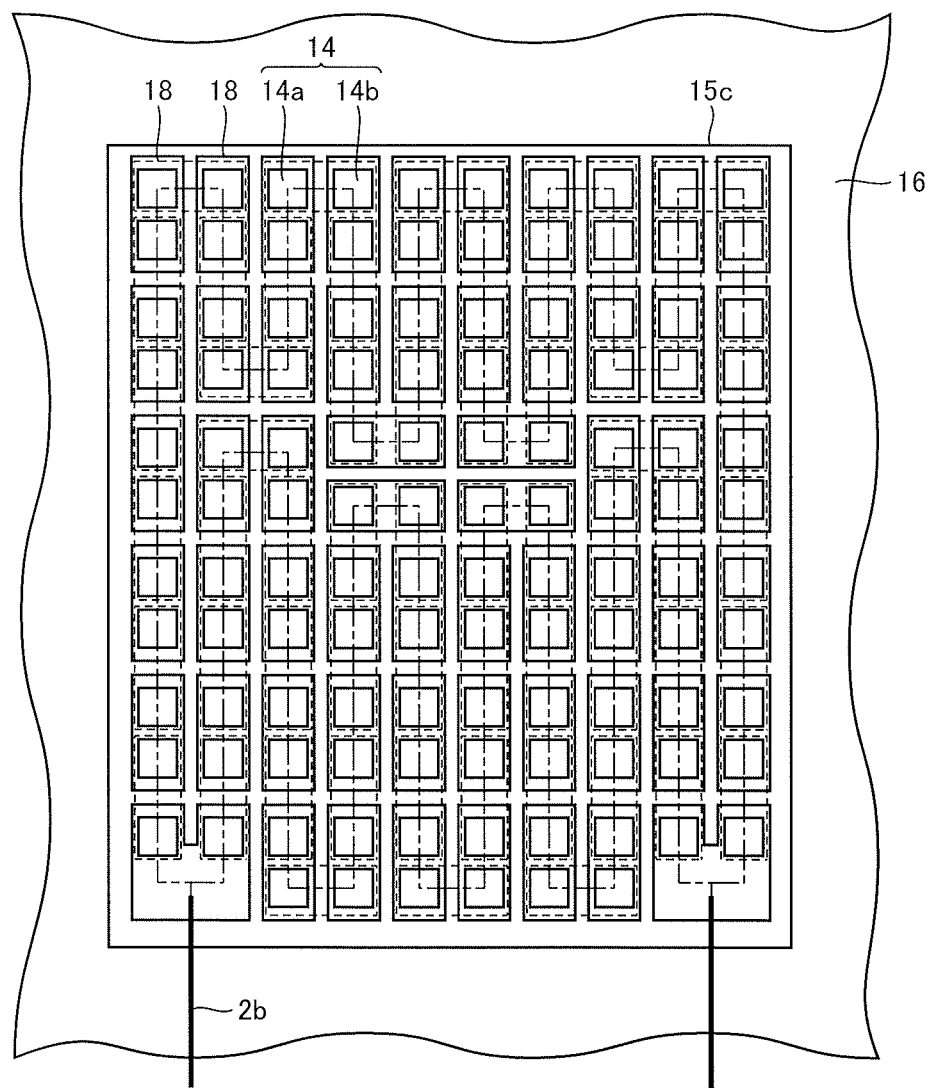
FIG. 23 is a plan view schematically showing a structure of a high temperature-use module according to a fifth embodiment of the present invention.

Referring to FIG. 23, in the high temperature-use module of the thermoelectric module of the present embodiment, p-type thermoelectric semiconductor elements 14a and high temperature-side wiring line 2b are arranged to be sandwiched between high temperature-side electrodes 18 between high temperature-side insulating substrate 13c and a high temperature-side substrate not shown. In FIG. 23, the high temperature-side substrate is not illustrated for ease of description, and high temperature-side electrode 18 on the side of the high temperature-side substrate is illustrated by broken lines.

Two p-type thermoelectric semiconductor elements 14a and high temperature-side wiring line 2b are located on the one end of high temperature-side electrode 18, and two n-type thermoelectric semiconductor elements 14b and high temperature-side wiring line 2b are located on the other end of high temperature-side electrode 18. A central section of high temperature-side electrode 18 is located between the one end and the other end of high temperature-side electrode 18. This central section of high temperature-side electrode 18 is configured to have independent parts, and a pair of p-type thermoelectric semiconductor element 14a and n-type thermoelectric semiconductor element 14b is mounted on each part of high temperature-side electrode 18. P-type thermoelectric semiconductor element 14a and n-type thermoelectric semiconductor element 14b are inserted into plurality of through-holes 16a of radiant heat blocking plate 16, respectively.

Two p-type thermoelectric semiconductor elements 14a mounted on the one end of high temperature-side electrode 18 are each connected to n-type thermoelectric semiconductor element 14b arranged on another part of the central section of high temperature-side electrode 18 with a part of high temperature-side electrode 18 indicated by broken lines. Similarly, two n-type thermoelectric semiconductor elements 14b mounted on the other end of high temperature-side electrode 18 are each connected to p-type thermoelectric semiconductor element 14a arranged on another part of the central section of high temperature-side electrode 18 with a part of high temperature-side electrode 18 indicated by broken lines.

P-type thermoelectric semiconductor element 14a located on the outer side of the one end of high temperature-side electrode 18, n-type thermoelectric semiconductor element 14b located on the outer side of the other end of high temperature-side electrode 18, and p-type thermoelectric semiconductor element 14a and n-type thermoelectric semiconductor element 14b located on the central section of high temperature-side electrode 18 are thereby electrically connected to each other with high temperature-side electrode 18. An external circuit is thus formed. P-type thermoelectric semiconductor element 14a located on the inner side of the one end of high temperature-side electrode 18, n-type thermoelectric semiconductor element 14b located on the inner side of the other end of high temperature-side electrode 18, and p-type thermoelectric semiconductor element 14a and n-type thermoelectric semiconductor element 14b located on the central section of high temperature-side electrode 18 are electrically connected to each other. An internal circuit is thus formed. On the one end and the other end of high temperature-side electrode 18, the external circuit and the internal circuit are connected electrically in parallel. That is, high temperature-side electrode 18 connects plurality of p-type thermoelectric semiconductor elements 14a and n-type thermoelectric semiconductor elements 14b electrically in parallel.

Since the remaining structure of the present embodiment is similar to the structure of the above-described first embodiment, the same element has the same reference character allotted, and description thereof will not be repeated.

Here, as a design guideline for connecting the external circuit and the internal circuit in parallel, the number of pairs of p-type thermoelectric semiconductor element 14a and n-type thermoelectric semiconductor element 14b in each of the external circuit and the internal circuit is identical, and the generated voltage in the external circuit and the internal circuit is equalized. Although the parallel number of the external circuit and the internal circuit in the thermoelectric module is two in the foregoing description, the generated voltage of the thermoelectric module should only be defined in accordance with a power module adjusting the output, and the parallel number may not be two.

In each of the above-described respective embodiments, thermoelectric module 10 of thermoelectric power generating apparatus 1 may not be provided with a soaking plate.

The above-described embodiments may be combined appropriately.

It should be understood that the embodiments disclosed herein are illustrative and non-restrictive in every respect. The scope of the present invention is defined by the claims not by the description above, and is intended to include any modification within the meaning and scope equivalent to the terms of the claims.

INDUSTRIAL APPLICABILITY

The present invention is applicable particularly advantageously to a thermoelectric module having low temperature-side and high temperature-side thermoelectric conversion elements, as well as a thermoelectric power generating apparatus and a thermoelectric generator including the same.

REFERENCE SIGNS LIST 1 thermoelectric power generating apparatus; 2 wiring line; 2a low temperature-side wiring line; 2b high temperature-side wiring line; 10 thermoelectric module; 11 low temperature-side member; 11a low temperature-side plate; 11b low temperature-side soaking plate; 11c low temperature-side substrate; 12 low temperature-side thermoelectric conversion element; 13 high temperature-side member; 13a high temperature-side plate; 13b high temperature-side soaking plate; 13c high temperature-side substrate; 14 high temperature-side thermoelectric conversion element; 15 insulating member; 15a central soaking plate; 15b low temperature-side insulating substrate; 15c high temperature-side insulating substrate; 16 radiant heat blocking plate; 16a through-hole; 16b insulating substrate; 16c covering part; 17 low temperature-side electrode; 18 high temperature-side electrode; 20 thermal circuit member; 21 spring member; 24 bolt; 25 spring; 31 solder material; 32 brazing material; 40 low-temperature heat transfer medium member; 41 low-temperature heat transfer medium; 50 high-temperature heat transfer medium member; 51 high-temperature heat transfer medium; 60 housing; 61 internal space; 100 thermoelectric generator.

The invention claimed is:

1. A thermoelectric module comprising:
   a low temperature-side member;
   a plurality of low temperature-side thermoelectric conversion elements arranged on a side of said low temperature-side member and made of a BiTe-based material;
   a low temperature-side electrode connecting said plurality of low temperature-side thermoelectric conversion elements electrically in series or in parallel;
   a low temperature-side wiring line electrically connected to said low temperature-side electrode;
   a high temperature-side member opposed to said low temperature-side member;

a plurality of high temperature-side thermoelectric conversion elements arranged on a side of said high temperature-side member and made of a material different from said BiTe-based material;

a high temperature-side electrode connecting said plurality of high temperature-side thermoelectric conversion elements electrically in series or in parallel;

a high temperature-side wiring line electrically connected to said high temperature-side electrode;

an insulating member sandwiched between said low temperature-side thermoelectric conversion elements and said high temperature-side thermoelectric conversion elements;

a radiant heat blocking plate arranged between said insulating member and said high temperature-side member, said radiant heat blocking plate being arranged on the side of said high temperature-side member with respect to said low temperature-side wiring line and said high temperature-side wiring line and said radiant heat blocking plate arranged apart from the insulating member and the high temperature-side member; and a thermal circuit member directly connecting said radiant heat blocking plate to said low temperature-side member and not connecting said radiant heat blocking plate to said high temperature-side member.

2. The thermoelectric module according to claim 1, wherein said thermal circuit member includes a spring member.

3. The thermoelectric module according to claim 1, wherein said low temperature-side member includes a low temperature-side plate connected to said thermal circuit member.

4. The thermoelectric module according to claim 3, wherein said low temperature-side member includes a low temperature-side soaking plate made of an insulating material and sandwiched between said plurality of low temperature-side thermoelectric conversion elements and said low temperature-side plate.

5. The thermoelectric module according to claim 1, wherein said radiant heat blocking plate includes
an insulating substrate, and
a covering part covering at least part of a surface of said insulating substrate on the side of said high temperature-side member.

6. The thermoelectric module according to claim 1, wherein said high temperature-side thermoelectric conversion elements contain one or more kinds of materials selected from the group consisting of a MgSi-based material, a SiGe-based material, a CoSb-based material, and a PbTe-based material.

7. The thermoelectric module according to claim 1, wherein
said low temperature-side thermoelectric conversion elements are attached to said low temperature-side electrode with a solder material, and
said high temperature-side thermoelectric conversion elements are attached to said high temperature-side electrode with a brazing material.

8. The thermoelectric module according to claim 1, wherein said high temperature-side wiring line extends through said insulating member and is arranged on the side of said low temperature-side member with respect to said insulating member.

9. A thermoelectric power generating apparatus comprising a plurality of thermoelectric modules as defined in claim 1,
said low temperature-side wiring line electrically connecting said low temperature-side electrodes of said plurality of thermoelectric modules to each other,
said high temperature-side wiring line electrically connecting said high temperature-side electrodes of said plurality of thermoelectric modules to each other.

10. A thermoelectric generator further comprising:
the thermoelectric power generating apparatus as defined in claim 9;
a low-temperature heat transfer medium member, attached to said low temperature-side member of said thermoelectric power generating apparatus, through which a low-temperature heat transfer medium circulates; and
a high-temperature heat transfer medium member, attached to said high temperature-side member of said thermoelectric power generating apparatus, through which a high-temperature heat transfer medium circulates.

11. The thermoelectric generator according to claim 10, further comprising a housing surrounding said thermoelectric power generating apparatus, said low-temperature heat transfer medium member and said high-temperature heat transfer medium member, wherein
an internal space of said housing is vacuum sealed.

* * * * *